(12) United States Patent
Shimizu

(10) Patent No.: US 9,711,362 B2
(45) Date of Patent: *Jul. 18, 2017

(54) SEMICONDUCTOR DEVICE AND METHOD OF MANUFACTURING THE SAME

(71) Applicant: Kabushiki Kaisha Toshiba, Minato-ku (JP)

(72) Inventor: Tatsuo Shimizu, Shinagawa (JP)

(73) Assignee: Kabushiki Kaisha Toshiba, Minato-ku (JP)

( * ) Notice: Subject to any disclaimer, the term of this patent is extended or adjusted under 35 U.S.C. 154(b) by 0 days.

This patent is subject to a terminal disclaimer.

(21) Appl. No.: 15/048,239

(22) Filed: Feb. 19, 2016

(65) Prior Publication Data

US 2016/0284830 A1    Sep. 29, 2016

(30) Foreign Application Priority Data

Mar. 24, 2015    (JP) .................. 2015-061798

(51) Int. Cl.
| | | |
|---|---|---|
| *H01L 29/778* | (2006.01) | |
| *H01L 21/28* | (2006.01) | |
| *H01L 29/66* | (2006.01) | |
| *H01L 29/51* | (2006.01) | |
| *H01L 29/40* | (2006.01) | |

(Continued)

(52) U.S. Cl.
CPC ...... *H01L 21/28264* (2013.01); *H01L 29/408* (2013.01); *H01L 29/513* (2013.01); *H01L 29/517* (2013.01); *H01L 29/66462* (2013.01); *H01L 29/7786* (2013.01); *H01L 29/7788* (2013.01); *H01L 29/0646* (2013.01); (Continued)

(58) Field of Classification Search
CPC .................................... H01L 29/205
See application file for complete search history.

(56) References Cited

U.S. PATENT DOCUMENTS

| 2008/0135880 A1 | 6/2008 | Yoshida et al. |
| 2011/0121313 A1 | 5/2011 | Briere |

(Continued)

FOREIGN PATENT DOCUMENTS

| JP | 2008-130672 | 6/2008 |
| JP | 2011-205071 | 10/2011 |

(Continued)

*Primary Examiner* — Fernando L Toledo
*Assistant Examiner* — Valerie N Newton
(74) *Attorney, Agent, or Firm* — Oblon, McClelland, Maier & Neustadt, L.L.P.

(57) ABSTRACT

A semiconductor device of an embodiment includes a first layer, a second layer provided on the first layer, the second layer forming a two-dimensional electron gas in the first layer, a source electrode provided on the second layer, a drain electrode provided on the second layer, a gate electrode provided between the source electrode and the drain electrode on the second layer, and a first insulating layer provided between the gate electrode and the drain electrode on the second layer, the first insulating layer being a first oxide of at least one first element selected from the group consisting of Hf, Zr, Ti, Al, La, Y, and Sc, the first insulating layer containing $5 \times 10^{19}$ cm$^{-3}$ or more of at least one second element selected from the group consisting of F, H, D, V, Nb, and Ta.

25 Claims, 8 Drawing Sheets

(51) Int. Cl.
     *H01L 29/423*     (2006.01)
     *H01L 29/06*     (2006.01)
     *H01L 29/20*     (2006.01)
     *H01L 29/24*     (2006.01)

(52) U.S. Cl.
     CPC .......... *H01L 29/2003* (2013.01); *H01L 29/24* (2013.01); *H01L 29/4236* (2013.01)

(56) References Cited

U.S. PATENT DOCUMENTS

| | | |
|---|---|---|
| 2011/0254062 A1 | 10/2011 | Shimizu et al. |
| 2013/0256686 A1* | 10/2013 | Kanamura ............ H01L 29/205 257/76 |
| 2016/0233379 A1* | 8/2016 | Qin .................. H01L 29/42316 |
| 2016/0284833 A1 | 9/2016 | Shimizu et al. |

FOREIGN PATENT DOCUMENTS

| | | |
|---|---|---|
| JP | 2011-228429 | 11/2011 |
| JP | 2016-181671 A | 10/2016 |

\* cited by examiner

SEMICONDUCTOR DEVICE AND METHOD OF MANUFACTURING THE SAME

CROSS-REFERENCE TO RELATED APPLICATION

This application is based upon and claims the benefit of priority from Japanese Patent Application No. 2015-061798, filed on Mar. 24, 2015, the entire contents of which are incorporated herein by reference.

FIELD

Embodiments described herein relate generally to a semiconductor device and a method of manufacturing the same.

BACKGROUND

In circuits such as switching power supplies and inverters, semiconductor elements such as switching elements and diodes are used. These semiconductor elements are required to have high breakdown voltage and low on-resistance. The relationship between breakdown voltage and on-resistance is a trade-off relationship that depends on element materials.

As technologies have advanced, semiconductor elements now have low on-resistance close to the limit for silicon, which is a principal element material. So as to further increase breakdown voltage or further reduce on-resistance, element materials need to be changed. If GaN-based semiconductors such as GaN and AlGaN are used as switching element materials, the trade-off relationship depending on materials can be improved and dramatically high breakdown voltage and low on-resistance can be achieved.

However, if a high drain voltage is applied to a switching element using a GaN-based semiconductor, a problem called "current collapse" that causes an increase in on-resistance occurs.

DETAILED DESCRIPTION

Figure 1:
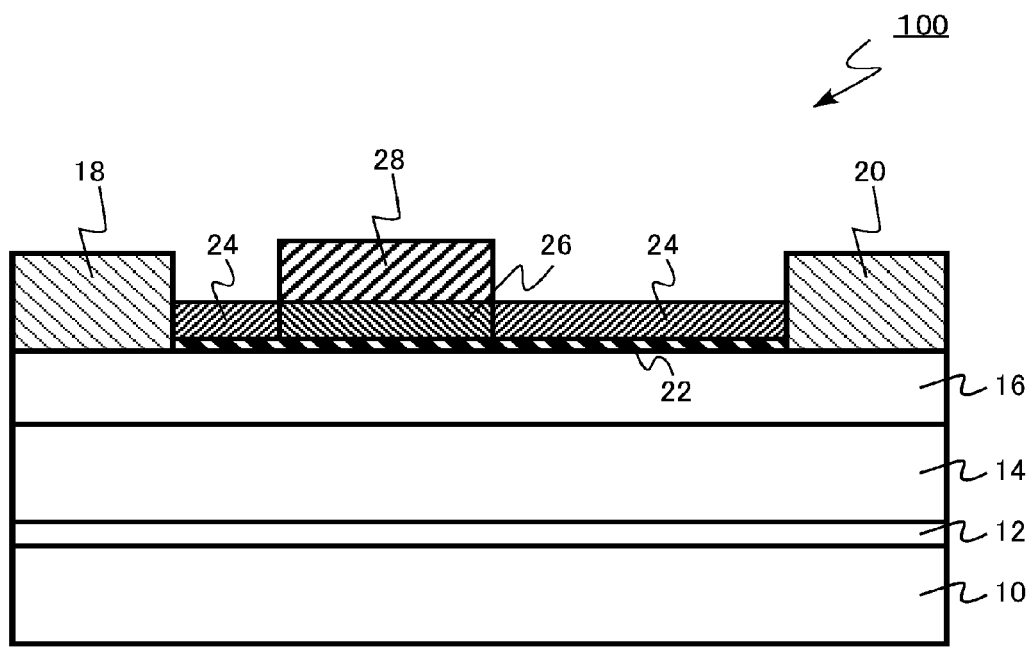
FIG. 1 is a schematic cross-sectional view of a semiconductor device of a first embodiment.

A semiconductor device of an embodiment of the present disclosure includes: a first layer; a second layer provided on the first layer, the second layer forming a two-dimensional electron gas in the first layer; a source electrode provided on the second layer; a drain electrode provided on the second layer; a gate electrode provided between the source electrode and the drain electrode on the second layer; and a first insulating layer provided between the gate electrode and the drain electrode on the second layer, the first insulating layer being a first oxide of at least one first element selected from the group consisting of Hf (hafnium), Zr (zirconium), Ti (titanium), Al (aluminum), La (lanthanum), Y (yttrium), and Sc (scandium), the first insulating layer containing $5 \times 10^{19}$ $cm^{-3}$ or more of at least one second element selected from the group consisting of F (fluorine), H (hydrogen), D (deuterium), V (vanadium), Nb (niobium), and Ta (tantalum).

In this specification, like or similar components are denoted by like reference numerals, and the same explanation is not repeated in some cases.

In this specification, a "GaN-based semiconductor" means a semiconductor containing GaN (gallium nitride), AlN (aluminum nitride), InN (indium nitride), or any intermediate composition of these materials.

In this specification, "undoped" means that an impurity concentration is equal to or lower than $1 \times 10^{15}$ $cm^{-3}$.

In this specification, to indicate the positional relationship among components and the like, the top of each drawing is regarded as the "top", and the bottom of each drawing is regarded as the "bottom". The concepts of "top" and "bottom" in this specification do not necessarily indicate the relationship with the direction of gravitational force.

First Embodiment

A semiconductor device of this embodiment includes: a first layer; a second layer provided on the first layer, the second layer forming a two-dimensional electron gas in the first layer; a source electrode provided on the second layer; a drain electrode provided on the second layer; a gate electrode provided between the source electrode and the drain electrode on the second layer; and a first insulating layer provided between the gate electrode and the drain electrode on the second layer, the first insulating layer being a first oxide of at least one first element selected from the group consisting of Hf (hafnium), Zr (zirconium), Ti (titanium), Al (aluminum), La (lanthanum), Y (yttrium), and Sc (scandium), the first insulating layer containing $5 \times 10^{19}$ $cm^{-3}$ or more of at least one second element selected from the group consisting of F (fluorine), H (hydrogen), D (deuterium), V (vanadium), Nb (niobium), and Ta (tantalum).

In this embodiment, the first layer and the second layer are GaN-based semiconductors. The bandgap of the second layer is wider than the bandgap of the first layer.

The semiconductor device of this embodiment further includes a second insulating layer provided between the second layer and the gate electrode, the second insulating layer being a second oxide of at least one third element selected from the group consisting of Hf (hafnium), Zr (zirconium), and Ti (titanium), the second insulating layer containing $5 \times 10^{19}$ $cm^{-3}$ or more of at least one fourth element selected from the group consisting of F (fluorine), H (hydrogen), D (deuterium), V (vanadium), Nb (niobium), and Ta (tantalum), and $5 \times 10^{19}$ $cm^{-3}$ or more of at least one fifth element selected from the group consisting of N (nitrogen), P (phosphorus), As (arsenic), Sb (antimony), Bi (bismuth), Be (beryllium), Mg (magnesium), Ca (calcium), Sr (strontium), Ba (barium), Sc (scandium), Y (yttrium), La (lanthanum), and lanthanoids (Ce, Pr, Nd, Pm, Sm, Eu, Gd, Tb, Dy, Ho, Er, Tm, Yb, and Lu).

Alternatively, the semiconductor device of this embodiment further includes a second insulating layer provided between the second layer and the gate electrode, the second insulating layer being a second oxide of at least one third element selected from the group consisting of Al (aluminum), La (lanthanum), Y (yttrium), and Sc (scandium), the second insulating layer containing $5 \times 10^{19}$ cm$^{-3}$ or more of at least one fourth element selected from the group consisting of F (fluorine), H (hydrogen), D (deuterium), V (vanadium), Nb (niobium), and Ta (tantalum), and $5 \times 10^{19}$ cm$^{-3}$ or more of at least one fifth element selected from the group consisting of N (nitrogen), P (phosphorus), As (arsenic), Sb (antimony), Bi (bismuth), Be (beryllium), Mg (magnesium), Ca (calcium), Sr (strontium), and Ba (barium).

FIG. 1 is a schematic cross-sectional view of a semiconductor device of this embodiment.

A semiconductor device of this embodiment is a HEMT (High Electron Mobility Transistor) using GaN-based semiconductors.

As shown in FIG. 1, a semiconductor device (HEMT) 100 includes a substrate 10, a buffer layer 12, a channel layer (the first layer) 14, a barrier layer (the second layer) 16, a source electrode 18, a drain electrode 20, an interface layer (the third or fourth insulating layer) 22, a protection layer (a passivation layer, or the first insulating layer) 24, a gate insulating layer (the second insulating layer) 26, and a gate electrode 28.

The substrate 10 is formed with silicon (Si), for example. Instead of silicon, it is possible to use sapphire (Al$_2$O$_3$) or silicon carbide (SiC), for example.

The buffer layer 12 is provided on the substrate 10. The buffer layer 12 has a function to reduce lattice mismatch between the substrate 10 and the channel layer 14. The buffer layer 12 is formed with a multilayer structure of aluminum gallium nitride (Al$_W$Ga$_{1-W}$N (0<W<1)), for example.

The channel layer 14 is provided on the buffer layer 12. The channel layer 14 is also called an electron transit layer. The channel layer 14 is undoped Al$_X$Ga$_{1-X}$N (0≤X<1), for example. More specifically, the channel layer 14 is undoped GaN, for example. The thickness of the channel layer 14 is not smaller than 0.1 μm and not greater than 10 μm, for example.

The barrier layer 16 is provided on the channel layer 14. The barrier layer 16 is also called an electron supply layer. The bandgap of the barrier layer 16 is wider than the bandgap of the channel layer 14. The barrier layer 16 is undoped Al$_Y$Ga$_{1-Y}$N (0<Y≤1, X<Y), for example. More specifically, the barrier layer 16 is undoped Al$_{0.25}$Ga$_{0.75}$N, for example. The thickness of the barrier layer 16 is not smaller than 10 nm and not greater than 100 nm, for example.

There is a heterojunction interface between the channel layer 14 and the barrier layer 16. A two-dimensional electron gas (2DEG) is formed in the channel layer 14 by the heterojunction interface of the HEMT 100, and turns into a carrier.

The interface layer 22 is provided on the barrier layer 16. The interface layer 22 is formed with silicon oxide, silicon nitride, silicon oxynitride, or aluminum oxide, for example. The thickness of the interface layer 22 is not smaller than 1 nm and not greater than 10 nm, for example.

The source electrode 18 and the drain electrode 20 are formed on the barrier layer 16. The source electrode 18 and the drain electrode 20 are metal electrodes, for example, and each of the metal electrodes is a stack structure formed with titanium (Ti) and aluminum (Al), for example. There are preferably ohmic contacts between the barrier layer 16 and the source and drain electrodes 18 and 20. The distance between the source electrode 18 and the drain electrode 20 is not shorter than 5 μm and not longer than 30 μm, for example.

The gate electrode 28 is provided on a portion of the barrier layer 16 located between the source electrode 18 and the drain electrode 20. The gate electrode 28 is a metal electrode, for example. The metal electrode is formed with titanium nitride (TiN), for example.

The protection layer 24 is provided on part of the surface of the barrier layer 16. The protection layer 24 is provided between the gate electrode 28 and the drain electrode 20, and between the gate electrode 28 and the source electrode 18. The thickness of the protection layer 24 is not smaller than 10 nm and not greater than 100 nm, for example. The interface layer 22 is provided between the barrier layer 16 and the protection layer 24.

The protection layer 24 is an oxide (the first oxide) of at least one first element selected from the group consisting of Hf (hafnium), Zr (zirconium), Ti (titanium), Al (aluminum), La (lanthanum), Y (yttrium), and Sc (scandium). The protection layer 24 also contains $5 \times 10^{19}$ cm$^{-3}$ or more of at least one second element selected from the group consisting of F (fluorine), H (hydrogen), D (deuterium), V (vanadium), Nb (niobium), and Ta (tantalum).

The gate insulating layer 26 is provided between the barrier layer 16 and the gate electrode 28. The interface layer 22 is provided between the barrier layer 16 and the gate insulating layer 26.

The gate insulating layer 26 is an oxide (the second oxide) of at least one third element selected from the group consisting of Hf (hafnium), Zr (zirconium), and Ti (titanium). The gate insulating layer 26 also contains $5 \times 10^{19}$ cm$^{-3}$ or more of at least one fourth element selected from the group consisting of F (fluorine), H (hydrogen), D (deuterium), V (vanadium), Nb (niobium), and Ta (tantalum), and $5 \times 10^{19}$ cm$^{-3}$ or more of at least one fifth element selected from the group consisting of N (nitrogen), P (phosphorus), As (arsenic), Sb (antimony), Bi (bismuth), Be (beryllium), Mg (magnesium), Ca (calcium), Sr (strontium), Ba (barium), Sc (scandium), Y (yttrium), La (lanthanum), and lanthanoids (Ce, Pr, Nd, Pm, Sm, Eu, Gd, Tb, Dy, Ho, Er, Tm, Yb, and Lu).

Alternatively, the gate insulating layer 26 is an oxide (the second oxide) of at least one third element selected from the group consisting of Al (aluminum), La (lanthanum), Y (yttrium), and Sc (scandium). The gate insulating layer 26 also contains $5 \times 10^{19}$ cm$^{-3}$ or more of at least one fourth element selected from the group consisting of F (fluorine), H (hydrogen), D (deuterium), V (vanadium), Nb (niobium), and Ta (tantalum), and $5 \times 10^{19}$ cm$^{-3}$ or more of at least one fifth element selected from the group consisting of N (nitrogen), P (phosphorus), As (arsenic), Sb (antimony), Bi (bismuth), Be (beryllium), Mg (magnesium), Ca (calcium), Sr (strontium), and Ba (barium).

The first oxide and the second oxide are preferably the same, and the second element and the fourth element are preferably the same. This is because, with this arrangement, the protection layer 24 and the gate insulating layer 26 can be more readily manufactured through a series of manufacturing procedures.

The first oxide and the second oxide may be silicon oxide, aluminum oxide, hafnium oxide, zirconium oxide, hafnium aluminum oxide, zirconium aluminum oxide, hafnium silicate, or zirconium silicate, for example.

Next, an example of a semiconductor device manufacturing method according to this embodiment is described. FIGS. 2 through 5 are schematic cross-sectional views of a semiconductor device of this embodiment being manufactured.

In the example case described below, the first oxide and the second oxide are hafnium oxide ($HfO_2$). That is, the first element and the third element are Hf (hafnium), the second element and the fourth element are F (fluorine), and the fifth element is N (nitrogen).

A method of manufacturing a semiconductor device of this embodiment includes: forming an oxide on a first layer and a second layer provided on the first layer, the second layer forming a two-dimensional electron gas in the first layer, the oxide being of at least one element selected from the group consisting of Hf (hafnium), Zr (zirconium), and Ti (titanium); introducing, into a predetermined region of the oxide, $5\times10^{19}$ $cm^{-3}$ or more of at least one element selected from the group consisting of N (nitrogen), P (phosphorus), As (arsenic), Sb (antimony), Bi (bismuth), Be (beryllium), Mg (magnesium), Ca (calcium), Sr (strontium), Ba (barium), Sc (scandium), Y (yttrium), La (lanthanum), and lanthanoids (Ce, Pr, Nd, Pm, Sm, Eu, Gd, Tb, Dy, Ho, Er, Tm, Yb, and Lu); introducing, into the oxide, at least one element selected from the group consisting of F (fluorine), H (hydrogen), D (deuterium), V (vanadium), Nb (niobium), and Ta (tantalum); and forming a gate electrode on the predetermined region of the oxide.

Alternatively, a method of manufacturing a semiconductor device of this embodiment includes: forming an oxide on a first layer and a second layer provided on the first layer, the second layer forming a two-dimensional electron gas in the first layer, the oxide being of at least one element selected from the group consisting of Al (aluminum), La (lanthanum), Y (yttrium), and Sc (scandium); introducing, into a predetermined region of the oxide, $5\times10^{19}$ $cm^{-3}$ or more of at least one element selected from the group consisting of N (nitrogen), P (phosphorus), As (arsenic), Sb (antimony), Bi (bismuth), Be (beryllium), Mg (magnesium), Ca (calcium), Sr (strontium), and Ba (barium); introducing, into the oxide, at least one element selected from the group consisting of F (fluorine), H (hydrogen), D (deuterium), V (vanadium), Nb (niobium), and Ta (tantalum); and forming a gate electrode on the predetermined region of the oxide.

First, the substrate 10 such as a Si substrate is prepared. The buffer layer 12 is then grown on the Si substrate through epitaxial growth, for example. The buffer layer 12 is grown by metalorganic chemical vapor deposition (MOCVD), for example.

On the buffer layer 12, undoped GaN to be the channel layer (first layer) 14 and undoped $Al_{0.25}Ga_{0.75}N$ to be the barrier layer (second layer) 16 are formed through epitaxial growth. The channel layer 14 and the barrier layer 16 are grown by MOCVD, for example.

The silicon oxide film (interface layer) 22 is then formed on the barrier layer 16. The silicon oxide film (interface layer) 22 is formed by CVD (Chemical Vapor Deposition), for example.

Figure 2:
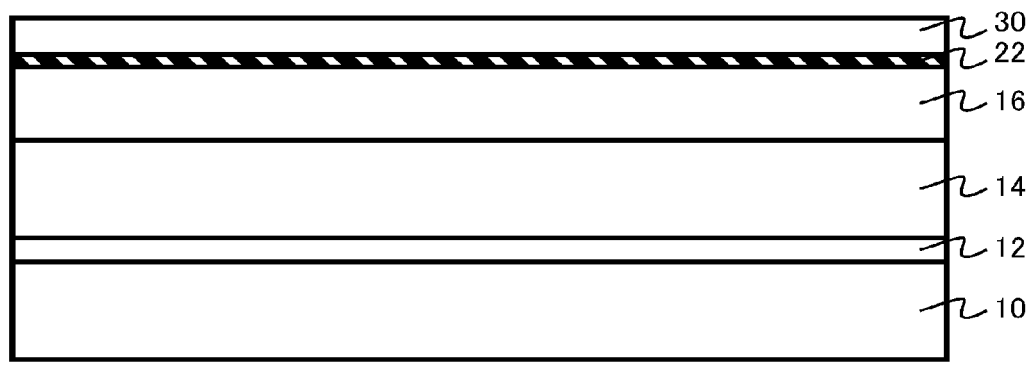
FIG. 2 is a schematic cross-sectional view of a semiconductor device of the first embodiment being manufactured.

A hafnium oxide film 30 is then formed on the silicon oxide film (interface layer) 22. The hafnium oxide film 30 is formed by CVD, for example (FIG. 2).

A mask material 32 having an opening in a predetermined region is then formed on the hafnium oxide film 30. The mask material 32 is a photoresist, for example.

Figure 3:
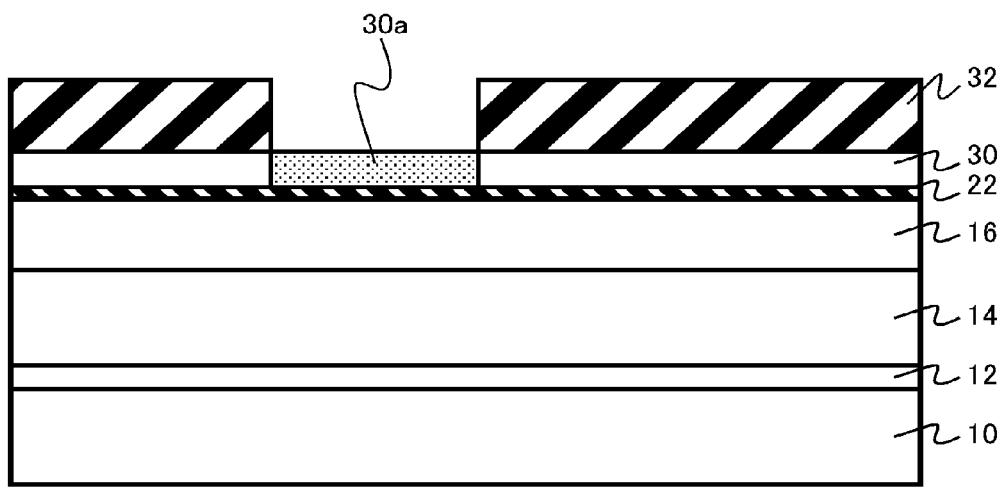
FIG. 3 is a schematic cross-sectional view of the semiconductor device of the first embodiment being manufactured.

With the mask material 32 serving as a mask, a nitriding treatment is performed in nitrogen plasma at room temperature. Through this nitriding treatment, N (nitrogen) is introduced into a predetermined region 30a of the hafnium oxide film 30 (FIG. 3).

If an element other than nitrogen, which is P, As, Sb, or Bi, is introduced, a plasma state at room temperature of these elements may be used. According to some other method, it is also possible to use a hydride ($NH_3$, $PH_3$, $AsH_3$, or $BiH_3$), or a fluoride ($NF_3$, $PF_3$, $AsF_3$, or $BiF_3$). According to yet another effective method, after a stacked insulating layer is formed, a mask is formed, and ions of N, P, As, Sb, or Bi are implanted and are piled up in the interface through thermal diffusion. By virtue of the mask, N, P, As, Sb, or Bi can be introduced into a local position. As for a metal species such as Sr, the metal may be vapor-deposited, or ions of the metal may be implanted and be subjected to thermal diffusion in the above described manner.

Figure 4:
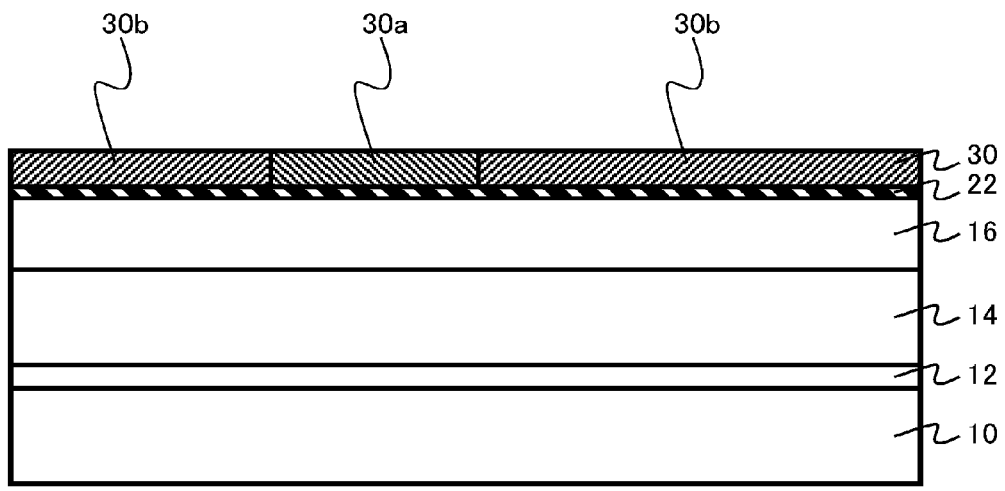
FIG. 4 is a schematic cross-sectional view of the semiconductor device of the first embodiment being manufactured.

The mask material 32 is then removed, and a fluorinating treatment is performed in fluorine plasma at room temperature. Through this fluorinating treatment, F (fluorine) is introduced into the entire region of the hafnium oxide film 30, or into both the predetermined region 30a and the region 30b other than the predetermined region 30a (FIG. 4). The predetermined region 30a of the hafnium oxide film 30 will later turn into the gate insulating layer 26, and the region 30b other than the predetermined region 30a will later turn into the protection layer 24.

If an element other than fluorine, which is H or D, is introduced, a plasma state at room temperature of these elements may be used. According to yet another effective method, after a stacked insulating layer is formed, a mask is formed, and ions of F, H, or D are implanted and are piled up in the interface through thermal diffusion. By virtue of the mask, F, H, or D can be introduced into a local position. As for a metal species such as Ta, the metal may be vapor-deposited, or ions of the metal may be implanted and be subjected to thermal diffusion in the above described manner.

Figure 5:
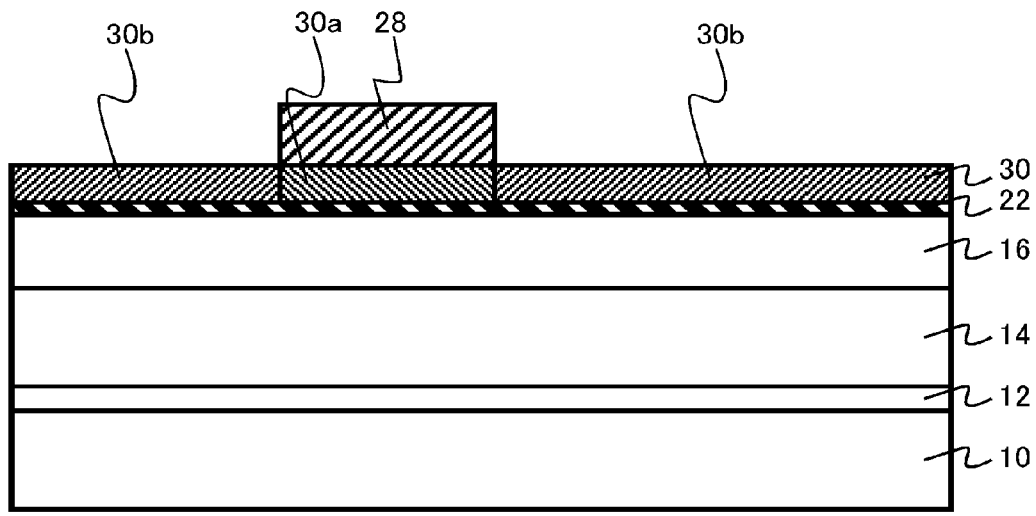
FIG. 5 is a schematic cross-sectional view of the semiconductor device of the first embodiment being manufactured.

The gate electrode 28 is then formed on the predetermined region 30a of the hafnium oxide film 30 (FIG. 5). After that, the source electrode 18 and the drain electrode 20 are formed on the barrier layer 16 by a known technique.

The drain electrode 20 is formed so that the region 30b other than the predetermined region 30a is interposed between the gate electrode 28 and the drain electrode 20. The source electrode 18 is formed so that the region 30b other than the predetermined region 30a is interposed between the gate electrode 28 and the source electrode 18.

By the above described manufacturing method, the HEMT 100 shown in FIG. 1 is formed.

Next, the functions and the effects of a semiconductor device of this embodiment are described.

Figure 6:
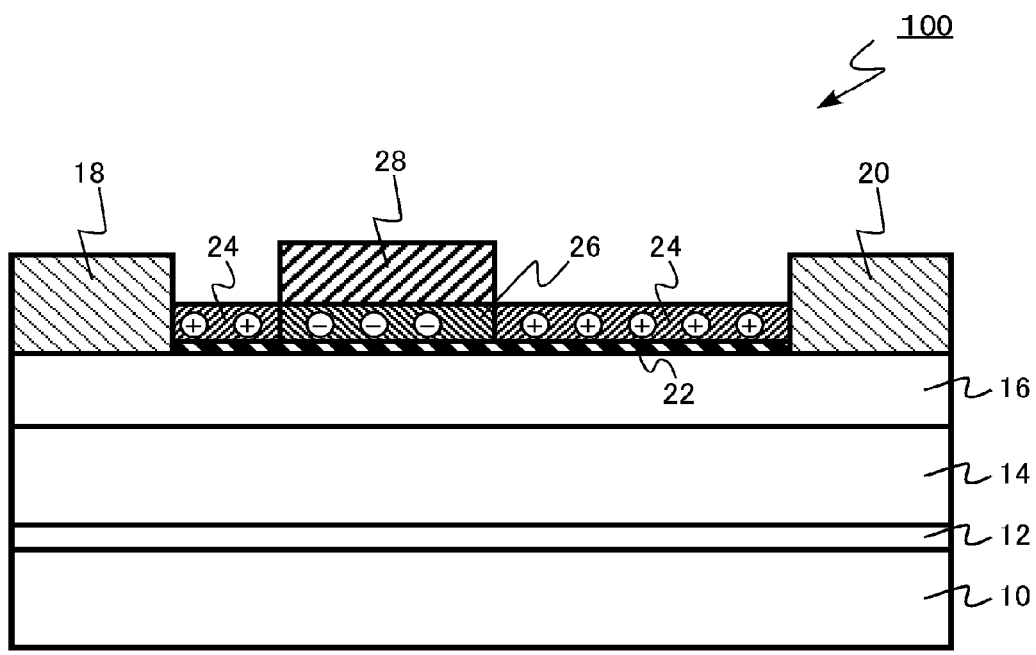
FIG. 6 is a diagram for explaining the functions and the effects of a semiconductor device of the first embodiment.

FIG. 6 is a diagram for explaining the functions and the effects of a semiconductor device of this embodiment.

A GaN-based HEMT has a problem called "current collapse", with which on-resistance becomes higher when a high drain voltage is applied. It is considered that "current collapse" occurs primarily due to electrons trapped in a portion of the protection layer located between the gate electrode and the drain electrode. That is, as electrons are trapped in the protection layer or in an interface between the protection layer and the substrate, the potential of the heterojunction interface changes, and the two-dimensional electron gas density becomes lower. It is considered that, as a result of the above, on-resistance becomes higher.

Also, in a GaN-based HEMT, a two-dimensional electron gas is generated even under the gate electrode. Therefore, "normally-on operation" that allows conduction without any voltage applied to the gate is normally performed. Particularly, in a HEMT involving a large amount of power, "normally-off operation" that does not allow conduction unless voltage is applied to the gate is required for safety reasons.

As shown in FIG. 6, in the HEMT 100 of this embodiment, the protection layer 24 holds positive fixed charge. The positive fixed charge is formed, as the protection layer 24 is an oxide (the first oxide) of at least one first element selected from the group consisting of Hf (hafnium), Zr (zirconium), Ti (titanium), Al (aluminum), La (lanthanum), Y (yttrium), and Sc (scandium), and contains $5 \times 10^{19}$ cm$^{-3}$ or more of at least one second element selected from the group consisting of F (fluorine), H (hydrogen), D (deuterium), V (vanadium), Nb (niobium), and Ta (tantalum).

As a result of a first principle calculation performed by the inventors, it has become clear that, when F (fluorine), H (hydrogen), or D (deuterium) is introduced into an oxide (the first oxide) of at least one element selected from the group consisting of Hf (hafnium), Zr (zirconium), Ti (titanium), Al (aluminum), La (lanthanum), Y (yttrium), and Sc (scandium), F (fluorine), H (hydrogen), or D (deuterium) enters oxygen defects in the oxide (the first oxide) and releases electrons, and stabilization is achieved. Accordingly, as F (fluorine), H (hydrogen), or D (deuterium) is introduced, positive fixed charge stably exists in the oxide (the first oxide).

Also, as a result of a first principle calculation performed by the inventors, it has become clear that, when V (vanadium), Nb (niobium), or Ta (tantalum) is introduced into an oxide (the first oxide) of at least one element selected from the group consisting of Hf (hafnium), Zr (zirconium), Ti (titanium), Al (aluminum), La (lanthanum), Y (yttrium), and Sc (scandium), Hf (hafnium), Zr (zirconium), Ti (titanium), Al (aluminum), La (lanthanum), Y (yttrium), or Sc (scandium) releases electrons and is replaced, and stabilization is achieved. Accordingly, as V (vanadium), Nb (niobium), or Ta (tantalum) is introduced, positive fixed charge stably exists in the oxide (the first oxide).

As the protection layer 24 holds a sufficient amount of positive fixed charge in its film, the potential variation in the heterojunction interface due to electrons trapped in the protection layer 24 or in the interface between the protection layer 24 (or the interface layer 22) and the barrier layer 16 can be reduced. Accordingly, current collapse can be restrained.

The concentration of at least one second element that is selected from the group consisting of F (fluorine), H (hydrogen), D (deuterium), V (vanadium), Nb (niobium), and Ta (tantalum), and is contained in the protection layer 24 is preferably not lower than $5 \times 10^{19}$ cm$^{-3}$ and not higher than $6.4 \times 10^{22}$ cm$^{-3}$. If the concentration is below the above mentioned range, current collapse might not be sufficiently restrained. Also, it is difficult to introduce the above element into the protection layer 24 at a concentration above the range.

Further, so as to increase the effect to restrain current collapse, the concentration of the above element is preferably not lower than $1 \times 10^{20}$ cm$^{-3}$, and more preferably, not lower than $5 \times 10^{20}$ cm$^{-3}$.

Also, as shown in FIG. 6, in the HEMT 100 of this embodiment, the gate insulating layer 26 holds negative fixed charge. This negative fixed charge is formed, as the gate insulating layer 26 is a second oxide of at least one third element selected from the group consisting of Hf (hafnium), Zr (zirconium), and Ti (titanium), and contains $5 \times 10^{19}$ cm$^{-3}$ or more of at least one fourth element selected from the group consisting of F (fluorine), H (hydrogen), D (deuterium), V (vanadium), Nb (niobium), and Ta (tantalum), and $5 \times 10^{19}$ cm$^{-3}$ or more of at least one fifth element selected from the group consisting of N (nitrogen), P (phosphorus), As (arsenic), Sb (antimony), Bi (bismuth), Be (beryllium), Mg (magnesium), Ca (calcium), Sr (strontium), Ba (barium), Sc (scandium), Y (yttrium), La (lanthanum), and lanthanoids (Ce, Pr, Nd, Pm, Sm, Eu, Gd, Tb, Dy, Ho, Er, Tm, Yb, and Lu). Alternatively, this negative fixed charge is formed, as the gate insulating layer 26 is a second oxide of at least one third element selected from the group consisting of Al (aluminum), La (lanthanum), Y (yttrium), and Sc (scandium), and contains $5 \times 10^{19}$ cm$^{-3}$ or more of at least one fourth element selected from the group consisting of F (fluorine), H (hydrogen), D (deuterium), V (vanadium), Nb (niobium), and Ta (tantalum), and $5 \times 10^{19}$ cm$^{-3}$ or more of at least one fifth element selected from the group consisting of N (nitrogen), P (phosphorus), As (arsenic), Sb (antimony), Bi (bismuth), Be (beryllium), Mg (magnesium), Ca (calcium), Sr (strontium), and Ba (barium).

As a result of a first principle calculation performed by the inventors, it has become clear that, when N (nitrogen), P (phosphorus), As (arsenic), Sb (antimony), Bi (bismuth), Be (beryllium), Mg (magnesium), Ca (calcium), Sr (strontium), Ba (barium), Sc (scandium), Y (yttrium), La (lanthanum), or a lanthanoid (Ce, Pr, Nd, Pm, Sm, Eu, Gd, Tb, Dy, Ho, Er, Tm, Yb, or Lu) is introduced into an oxide (the second oxide) of at least one element selected from the group consisting of Hf (hafnium), Zr (zirconium), and Ti (titanium), oxygen defects are generated, and stabilization is achieved. Further, it has become clear that, when F (fluorine), H (hydrogen), D (deuterium), V (vanadium), Nb (niobium), or Ta (tantalum) is introduced into the oxide (second oxide) having the oxygen defects generated therein, electrons are released to fill the oxygen defects, and N (nitrogen), P (phosphorus), As (arsenic), Sb (antimony), Bi (bismuth), Be (beryllium), Mg (magnesium), Ca (calcium), Sr (strontium), Ba (barium), Sc (scandium), Y (yttrium), La (lanthanum), or a lanthanoid (Ce, Pr, Nd, Pm, Sm, Eu, Gd, Tb, Dy, Ho, Er, Tm, Yb, or Lu) turns into negative fixed charge that stabilizes.

Also, as a result of a first principle calculation performed by the inventors, it has become clear that, when N (nitrogen), P (phosphorus), As (arsenic), Sb (antimony), Bi (bismuth), Be (beryllium), Mg (magnesium), Ca (calcium), Sr (strontium), or Ba (barium) is introduced into an oxide (the second oxide) of at least one element selected from the group consisting of Al (aluminum), La (lanthanum), Y (yttrium), and Sc (scandium), oxygen defects are generated, and stabilization is achieved. Further, it has become clear that, when F (fluorine), H (hydrogen), D (deuterium), V (vanadium), Nb (niobium), or Ta (tantalum) is introduced into the oxide (second oxide) having the oxygen defects generated therein, electrons are released to fill the oxygen defects, and N (nitrogen), P (phosphorus), As (arsenic), Sb (antimony), Bi (bismuth), Be (beryllium), Mg (magnesium), Ca (calcium), Sr (strontium), or Ba (barium) turns into negative fixed charge that stabilizes.

As the gate insulating layer 26 holds a sufficient amount of negative fixed charge in its film, the threshold voltage of the HEMT can be made higher. Accordingly, normally-off operation of the HEMT 100 can be realized.

The concentration of at least one fourth element that is selected from the group consisting of F (fluorine), H (hydrogen), D (deuterium), V (vanadium), Nb (niobium), and Ta (tantalum), and is contained in the gate insulating layer 26 is preferably not lower than $5 \times 10^{19}$ cm$^{-3}$ and not higher than $6.4 \times 10^{22}$ cm$^{-3}$. Also, the concentration of at least one fifth element selected from the group consisting of N (nitrogen), P (phosphorus), As (arsenic), Sb (antimony), Bi (bismuth), Be (beryllium), Mg (magnesium), Ca (calcium), Sr (strontium), Ba (barium), Sc (scandium), Y (yttrium), La (lanthanum), and lanthanoids (Ce, Pr, Nd, Pm, Sm, Eu, Gd, Tb, Dy, Ho, Er, Tm, Yb, and Lu) is preferably not lower than $5 \times 10^{19}$ cm$^{-3}$ and not higher than $6.4 \times 10^{22}$ cm$^{-3}$.

If the concentration is below the above mentioned range, there is a possibility that normally-off operation will not be realized. Also, it is difficult to introduce the above element into the gate insulating layer 26 at a concentration above the range.

Further, so as to make the threshold voltage higher, the concentrations of the above elements (the fourth and fifth elements) are preferably not lower than $1 \times 10^{20}$ cm$^{-3}$, and more preferably, not lower than $5 \times 10^{20}$ cm$^{-3}$.

With a semiconductor device of this embodiment, current collapse can be restrained while normally-off operation is realized. Also, according to a method of manufacturing a semiconductor device of this embodiment, current collapse can be restrained while normally-off operation is realized through a simple process.

Second Embodiment

A semiconductor device of this embodiment is the same as a semiconductor device of the first embodiment, except that the gate insulating layer does not contain any fourth element selected from the group consisting of F (fluorine), H (hydrogen), D (deuterium), V (vanadium), Nb (niobium), and Ta (tantalum), and any fifth element selected from the group consisting of N (nitrogen), P (phosphorus), As (arsenic), Sb (antimony), Bi (bismuth), Be (beryllium), Mg (magnesium), Ca (calcium), Sr (strontium), Ba (barium), Sc (scandium), Y (yttrium), La (lanthanum), and lanthanoids (Ce, Pr, Nd, Pm, Sm, Eu, Gd, Tb, Dy, Ho, Er, Tm, Yb, and Lu). Therefore, the same explanations as those in the first embodiment will not be repeated.

Figure 7:
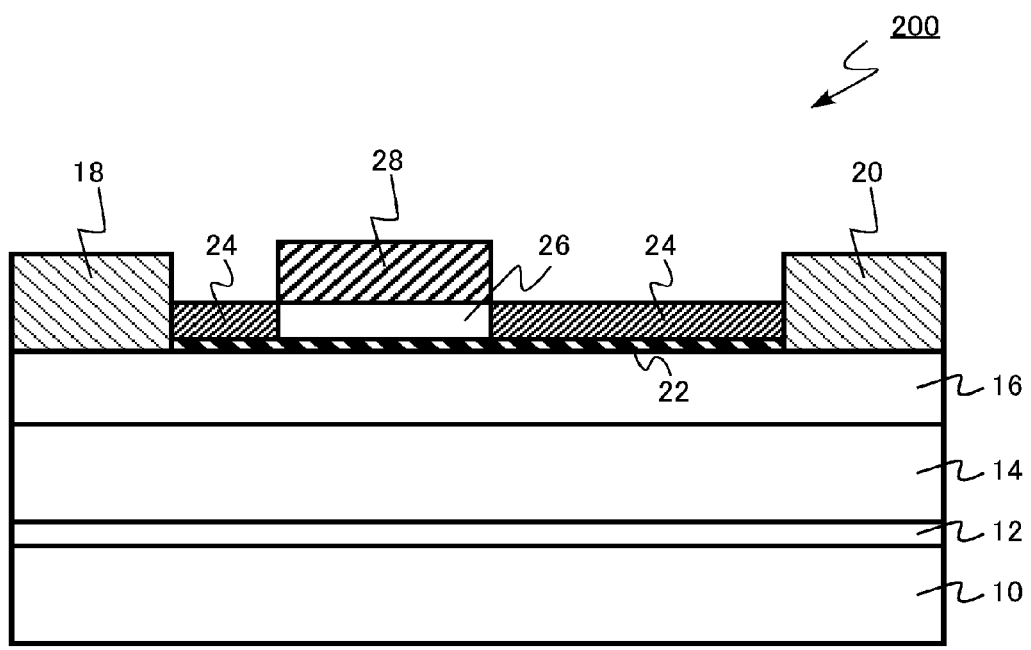
FIG. 7 is a schematic cross-sectional view of a semiconductor device of a second embodiment.

FIG. 7 is a schematic cross-sectional view of a semiconductor device of this embodiment.

In a semiconductor device (HEMT) 200, the gate insulating layer 26 does not contain any fourth element selected from the group consisting of F (fluorine), H (hydrogen), D (deuterium), V (vanadium), Nb (niobium), and Ta (tantalum), and any fifth element selected from the group consisting of N (nitrogen), P (phosphorus), As (arsenic), Sb (antimony), Bi (bismuth), Be (beryllium), Mg (magnesium), Ca (calcium), Sr (strontium), Ba (barium), Sc (scandium), Y (yttrium), La (lanthanum), and lanthanoids (Ce, Pr, Nd, Pm, Sm, Eu, Gd, Tb, Dy, Ho, Er, Tm, Yb, and Lu).

Meanwhile, the protection layer 24 is an oxide (the first oxide) of at least one first element selected from the group consisting of Hf (hafnium), Zr (zirconium), Ti (titanium), Al (aluminum), La (lanthanum), Y (yttrium), and Sc (scandium), as in the first embodiment. The protection layer 24 is an oxide (the first oxide) of at least one first element selected from the group consisting of Hf (hafnium), Zr (zirconium), Ti (titanium), Al (aluminum), La (lanthanum), Y (yttrium), and Sc (scandium). The protection layer 24 also contains $5 \times 10^{19}$ cm$^{-3}$ or more of at least one second element selected from the group consisting of F (fluorine), H (hydrogen), D (deuterium), V (vanadium), Nb (niobium), and Ta (tantalum).

In the HEMT 200 of this embodiment, the protection layer 24 holds positive fixed charge. Accordingly, with a semiconductor device of this embodiment, current collapse can be restrained.

Third Embodiment

A semiconductor device of this embodiment is the same as a semiconductor device of the first embodiment, except that the protection layer does not contain any second element selected from the group consisting of F (fluorine), H (hydrogen), D (deuterium), V (vanadium), Nb (niobium), and Ta (tantalum). Therefore, the same explanations as those in the first embodiment will not be repeated.

Figure 8:
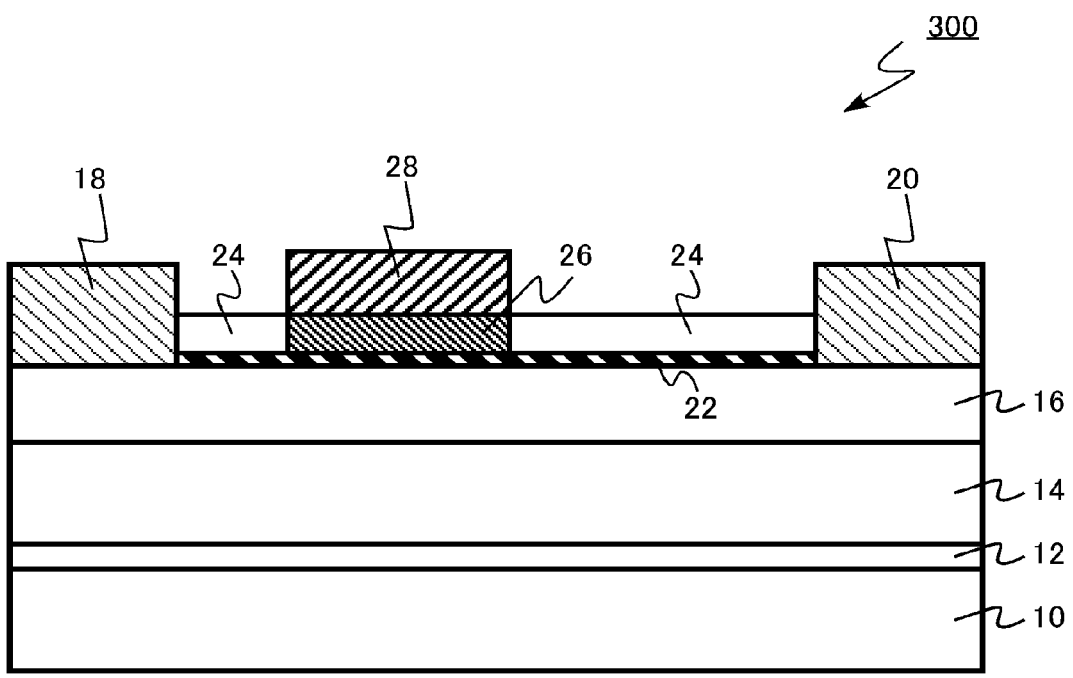
FIG. 8 is a schematic cross-sectional view of a semiconductor device of a third embodiment.

FIG. 8 is a schematic cross-sectional view of a semiconductor device of this embodiment.

In a semiconductor device (HEMT) 300, the protection layer 24 does not contain any second element selected from the group consisting of F (fluorine), H (hydrogen), D (deuterium), V (vanadium), Nb (niobium), and Ta (tantalum).

Meanwhile, the gate insulating layer 26 is an oxide (the second oxide) of at least one third element selected from the group consisting of Hf (hafnium), Zr (zirconium), and Ti (titanium), as in the first embodiment. Also, the gate insulating layer 26 contains $5 \times 10^{19}$ cm$^{-3}$ or more of at least one fourth element selected from the group consisting of F (fluorine), H (hydrogen), D (deuterium), V (vanadium), Nb (niobium), and Ta (tantalum), and $5 \times 10^{19}$ cm$^{-3}$ or more of at least one fifth element selected from the group consisting of N (nitrogen), P (phosphorus), As (arsenic), Sb (antimony), Bi (bismuth), Be (beryllium), Mg (magnesium), Ca (calcium), Sr (strontium), Ba (barium), Sc (scandium), Y (yttrium), La (lanthanum), and lanthanoids (Ce, Pr, Nd, Pm, Sm, Eu, Gd, Tb, Dy, Ho, Er, Tm, Yb, and Lu).

Alternatively, the gate insulating layer 26 is an oxide (the second oxide) of at least one third element selected from the group consisting of Al (aluminum), La (lanthanum), Y (yttrium), and Sc (scandium). Also, the gate insulating layer 26 contains $5 \times 10^{19}$ cm$^{-3}$ or more of at least one fourth element selected from the group consisting of F (fluorine), H (hydrogen), D (deuterium), V (vanadium), Nb (niobium), and Ta (tantalum), and $5 \times 10^{19}$ cm$^{-3}$ or more of at least one fifth element selected from the group consisting of N (nitrogen), P (phosphorus), As (arsenic), Sb (antimony), Bi (bismuth), Be (beryllium), Mg (magnesium), Ca (calcium), Sr (strontium), and Ba (barium).

In the HEMT 300 of this embodiment, the gate insulating layer 26 holds negative fixed charge. Accordingly, with a semiconductor device of this embodiment, normally-off operation is realized.

Fourth Embodiment

A semiconductor device of this embodiment is the same as a semiconductor device of the first embodiment, except for having a so-called gate recess structure in which the gate electrode is buried in a recess formed in the second layer. Therefore, the same explanations as those in the first embodiment will not be repeated.

Figure 9:
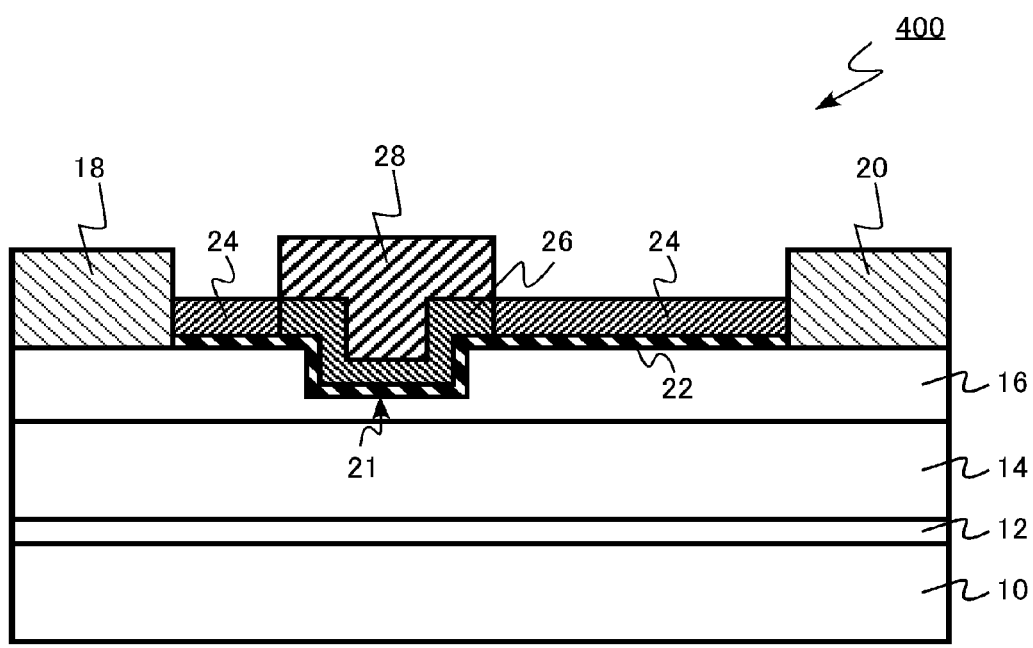
FIG. 9 is a schematic cross-sectional view of a semiconductor device of a fourth embodiment.

FIG. 9 is a schematic cross-sectional view of a semiconductor device of this embodiment.

A semiconductor device (HEMT) 400 has the gate insulating layer 26 formed on the inner surface of a recess 21 formed in a portion of the barrier layer (second layer) 16 located between the source electrode 18 and the drain electrode 20. The bottom portion of the recess 21 is located in the barrier layer 16.

With a semiconductor device of this embodiment, current collapse can be restrained while normally-off operation is realized, as in the first embodiment. Also, as a gate recess structure is provided, normally-off operation can be more readily realized.

Fifth Embodiment

A semiconductor device of this embodiment differs from a semiconductor device of the first embodiment in being a vertical device. The same explanations as those in the first embodiment will not be repeated.

Figure 10:
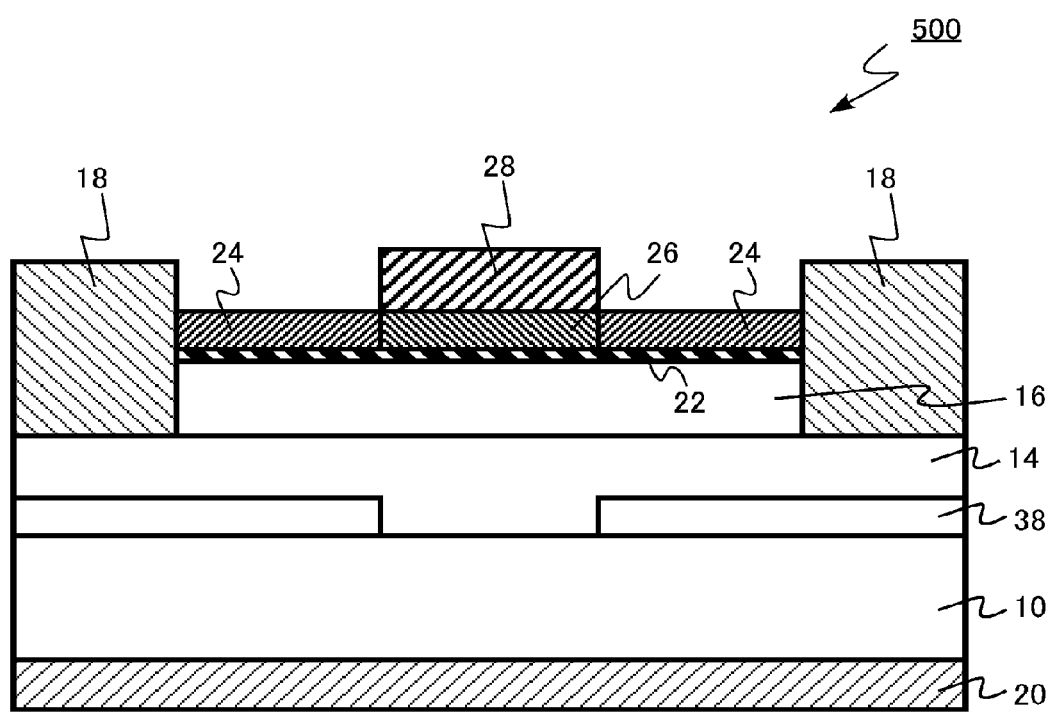
FIG. 10 is a schematic cross-sectional view of a semiconductor device of a fifth embodiment.

FIG. 10 is a schematic cross-sectional view of a semiconductor device of this embodiment.

A semiconductor device of this embodiment is a vertical HEMT using a GaN-based semiconductor that has the drain electrode on the back surface side of the substrate.

As shown in FIG. 10, a semiconductor device (HEMT) 500 includes a substrate 10, a channel layer (the first layer) 14, a barrier layer (the second layer) 16, a source electrode 18, a drain electrode 20, an interface layer (the third or fourth insulating layer) 22, a protection layer (a passivation layer, or the first insulating layer) 24, a gate insulating layer (the second insulating layer) 26, a gate electrode 28, and a p-type GaN layer 38.

The drain electrode 20 is provided on the back surface side of the substrate 10. The channel layer 14 is an n-type doped GaN layer. Drain current flows vertically in the channel layer 14.

As a manufacturing method, it is possible to employ a method of epitaxially growing p-GaN on GaN and reversing it to the n-type by ion implantation. Alternatively, p-GaN and n-GaN may be epitaxially grown in this order on GaN, and the p-GaN may be partially reversed to the n-type by ion implantation. AlGaN is then formed thereon, so that a 2DEG is formed.

With a semiconductor device of this embodiment, the protection layer 24 holds positive fixed charge, and the gate insulating layer 26 holds negative fixed charge. Accordingly, the characteristics of the vertical HEMT can be improved.

Sixth Embodiment

A semiconductor device of this embodiment differs from a semiconductor device of the first embodiment in that the first layer and the second layer are formed with oxides. The same explanations as those in the first embodiment will not be repeated.

Figure 11:
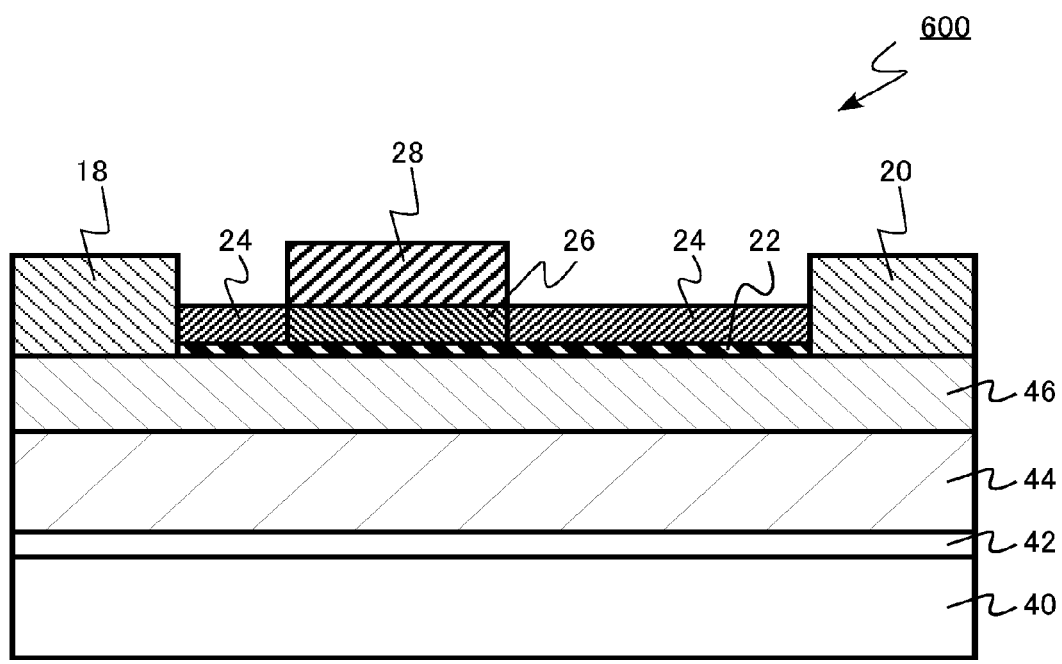
FIG. 11 is a schematic cross-sectional view of a semiconductor device of a sixth embodiment.

FIG. 11 is a schematic cross-sectional view of a semiconductor device of this embodiment.

A semiconductor device of this embodiment is a HEMT in which the channel layer (first layer) 14 and the barrier layer (second layer) 16 are formed with oxides.

As shown in FIG. 11, a semiconductor device (HEMT) 600 includes a substrate 40, a buffer layer 42, a channel layer (the first layer) 44, a barrier layer (the second layer) 46, a source electrode 18, a drain electrode 20, an interface layer (the third or fourth insulating layer) 22, a protection layer (a passivation layer, or the first insulating layer) 24, a gate insulating layer (the second insulating layer) 26, and a gate electrode 28.

The substrate 40 is formed with $n^+$-type silicon (Si), for example. The buffer layer 42 is formed with TiAlN, for example.

The channel layer 44 is formed with $SrTiO_3$, for example. The barrier layer 46 is formed with $LaAlO_3$, for example.

There is a heterojunction interface between the channel layer 44 and the barrier layer 46. A two-dimensional electron gas (2DEG) is formed in channel layer 44 by the heterojunction interface of the HEMT 600, and turns into a carrier.

The source electrode and the drain electrode are preferably formed with Nb-doped $SrTiO_3$, La-doped $SrTiO_3$, or the like. The gate electrode is preferably formed with $SrRuO_3$ or the like. These electrodes can be formed by CVD or through sputter film formation. As for the manufacturing method, both $SrTiO_3$ and $LaAlO_3$ can be epitaxially grown by CVD.

With a semiconductor device of this embodiment, current collapse can be restrained while normally-off operation is realized, as in the first embodiment.

In the above described embodiments, GaN and AlGaN are used as the materials of GaN-based semiconductor layers. However, it is also possible to use InGaN, InAlN, or InAlGaN, which contains indium (In), for example. Further, it is also possible to use AlN as the material of a GaN-based semiconductor layer.

Although undoped AlGaN is used as the barrier layer in the above described embodiments, it is also possible to use n-type AlGaN.

A conventional charge trapping film requires a charge injection operation, but the charge injection can be performed advantageously at high density. With a conventional charge trapping film, charge is released as time passes, and the threshold voltage becomes lower, resulting in a problem. This means that the trap state is not very stable.

In the above described embodiments, on the other hand, negative fixed charge or positive fixed charge can be formed in a stable manner in the gate insulating layer. The fixed charge is very stable, and does not exit from the insulating layer. The only problem is that the trap amount cannot be made very large. However, this problem can be readily solved, as density is increased by forming a thick film and forming traps in the entire film.

While certain embodiments have been described, these embodiments have been presented by way of example only, and are not intended to limit the scope of the inventions. Indeed, a semiconductor device and a method of manufacturing the same described herein may be embodied in a variety of other forms; furthermore, various omissions, substitutions and changes in the form of the devices and methods described herein may be made without departing from the spirit of the inventions. The accompanying claims and their equivalents are intended to cover such forms or modifications as would fall within the scope and spirit of the inventions.

What is claimed is:

1. A semiconductor device, comprising:
   a first layer;
   a second layer provided on the first layer, the second layer configured to form a two-dimensional electron gas in the first layer;
   a source electrode provided on the second layer;
   a drain electrode provided on the second layer;
   a gate electrode provided between the source electrode and the drain electrode on the second layer; and
   a first insulating layer provided between the gate electrode and the drain electrode on the second layer,
   wherein:
   the first insulating layer comprises a first oxide of at least one first element selected from the group consisting of Hf (hafnium), Zr (zirconium), Ti (titanium), Al (aluminum), La (lanthanum), Y (yttrium), and Sc (scandium); and the first insulating layer comprises $5 \times 10^{19}$ cm$^{-3}$ or more of at least one second element selected from the group consisting of H (hydrogen), D (deuterium), V (vanadium), Nb (niobium), and Ta (tantalum).

2. The device according to claim 1, wherein:
the first layer and the second layer are GaN-based semiconductors; and
the second layer has a wider bandgap than a bandgap of the first layer.

3. The device according to claim 1, wherein the first layer and the second layer are oxides.

4. The device according to claim 1, further comprising:
a second insulating layer provided between the second layer and the gate electrode,
wherein:
the second insulating layer comprises a second oxide of at least one third element selected from the group consisting of Hf (hafnium), Zr (zirconium), and Ti (titanium); and
the second insulating layer comprises $5 \times 10^{19}$ cm$^{-3}$ or more of at least one fourth element selected from the group consisting of H (hydrogen), D (deuterium), V (vanadium), Nb (niobium), and Ta (tantalum), and $5 \times 10^{19}$ cm$^{-3}$ or more of at least one fifth element selected from the group consisting of N (nitrogen), P (phosphorus), As (arsenic), Sb (antimony), Bi (bismuth), Be (beryllium), Mg (magnesium), Ca (calcium), Sr (strontium), Ba (barium), Sc (scandium), Y (yttrium), La (lanthanum), and lanthanoids (Ce, Pr, Nd, Pm, Sm, Eu, Gd, Tb, Dy, Ho, Er, Tm, Yb, and Lu).

5. The device according to claim 1, further comprising:
a second insulating layer provided between the second layer and the gate electrode,
wherein:
the second insulating layer comprises a second oxide of at least one third element selected from the group consisting of Al (aluminum), La (lanthanum), Y (yttrium), and Sc (scandium); and
the second insulating layer comprises $5 \times 10^{19}$ cm$^{-3}$ or more of at least one fourth element selected from the group consisting of H (hydrogen), D (deuterium), V (vanadium), Nb (niobium), and Ta (tantalum), and $5 \times 10^{19}$ cm$^{-3}$ or more of at least one fifth element selected from the group consisting of N (nitrogen), P (phosphorus), As (arsenic), Sb (antimony), Bi (bismuth), Be (beryllium), Mg (magnesium), Ca (calcium), Sr (strontium), and Ba (barium).

6. The device according to claim 4, wherein:
the first oxide and the second oxide are the same; and
the second element and the fourth element are the same.

7. The device according to claim 4, further comprising:
a third insulating layer provided between the second layer and the first insulating layer; and
a fourth insulating layer provided between the second layer and the second insulating layer.

8. The device according to claim 5, wherein:
the first oxide and the second oxide are the same; and
the second element and the fourth element are the same.

9. The device according to claim 5, further comprising:
a third insulating layer provided between the second layer and the first insulating layer; and
a fourth insulating layer provided between the second layer and the second insulating layer.

10. A semiconductor device, comprising:
a first layer;
a second layer provided on the first layer, the second layer configured to form a two-dimensional electron gas in the first layer;
a source electrode provided on the second layer;
a drain electrode provided on the second layer;
a gate electrode provided between the source electrode and the drain electrode on the second layer; and
a first insulating layer provided between the second layer and the gate electrode,
wherein:
the first insulating layer comprises a first oxide of at least one first element selected from the group consisting of Hf (hafnium), Zr (zirconium), and Ti (titanium); and
the first insulating layer comprises $5 \times 10^{19}$ cm$^{-3}$ or more of at least one second element selected from the group consisting of H (hydrogen), D (deuterium), V (vanadium), Nb (niobium), and Ta (tantalum), and $5 \times 10^{19}$ cm$^{-3}$ or more of at least one third element selected from the group consisting of N (nitrogen), P (phosphorus), As (arsenic), Sb (antimony), Bi (bismuth), Be (beryllium), Mg (magnesium), Ca (calcium), Sr (strontium), Ba (barium), Sc (scandium), Y (yttrium), La (lanthanum), and lanthanoids (Ce, Pr, Nd, Pm, Sm, Eu, Gd, Tb, Dy, Ho, Er, Tm, Yb, and Lu).

11. The device according to claim 10, wherein:
the first layer and the second layer are GaN-based semiconductors; and
the second layer has a wider bandgap than a bandgap of the first layer.

12. The device according to claim 10, wherein the first layer and the second layer are oxides.

13. The device according to claim 10, further comprising:
a second insulating layer provided between the second layer and the first insulating layer.

14. A semiconductor device, comprising:
a first layer;
a second layer provided on the first layer, the second layer configured to form a two-dimensional electron gas in the first layer;
a source electrode provided on the second layer;
a drain electrode provided on the second layer;
a gate electrode provided between the source electrode and the drain electrode on the second layer; and
a first insulating layer provided between the second layer and the gate electrode,
wherein:
the first insulating layer comprises a first oxide of at least one first element selected from the group consisting of Al (aluminum), La (lanthanum), Y (yttrium), and Sc (scandium); and
the first insulating layer comprises $5 \times 10^{19}$ cm$^{-3}$ or more of at least one second element selected from the group consisting of H (hydrogen), D (deuterium), V (vanadium), Nb (niobium), and Ta (tantalum), and $5 \times 10^{19}$ cm$^{-3}$ or more of at least one third element selected from the group consisting of N (nitrogen), P (phosphorus), As (arsenic), Sb (antimony), Bi (bismuth), Be (beryllium), Mg (magnesium), Ca (calcium), Sr (strontium), and Ba (barium).

15. The device according to claim 14, wherein:
the first layer and the second layer are GaN-based semiconductors; and
the second layer has a wider bandgap than a bandgap of the first layer.

16. The device according to claim 14, wherein the first layer and the second layer are oxides.

17. The device according to claim 14, further comprising:
a second insulating layer provided between the second layer and the first insulating layer.

18. A semiconductor device, comprising:
a first layer;
a second layer provided on the first layer, the second layer configured to form a two-dimensional electron gas in the first layer;
a source electrode provided on the second layer;
a drain electrode provided on the second layer;
a gate electrode provided between the source electrode and the drain electrode on the second layer; and
a first insulating layer provided between the gate electrode and the drain electrode on the second layer,
wherein:
the first insulating layer comprises a first oxide of at least one first element selected from the group consisting of Hf (hafnium), Zr (zirconium), Ti (titanium), Al (aluminum), La (lanthanum), Y (yttrium), and Sc (scandium);
the first insulating layer comprises $5 \times 10^{19}$ cm$^{-3}$ or more of at least one second element selected from the group consisting of F (fluorine), H (hydrogen), D (deuterium), V (vanadium), Nb (niobium), and Ta (tantalum); and
the first insulating layer includes a positive fixed charge.

19. A semiconductor device, comprising: a first layer;
a second layer provided on the first layer, the second layer configured to form a two-dimensional electron gas in the first layer;
a source electrode provided on the second layer; a drain electrode provided on the second layer;
a gate electrode provided between the source electrode and the drain electrode on the second layer; and
a first insulating layer provided between the gate electrode and the drain electrode on the second layer, wherein:
the first insulating layer comprises a first oxide of at least one first element selected from the group consisting of Hf (hafnium), Zr (zirconium), Ti (titanium), Al (aluminum), La (lanthanum), Y (yttrium), and Sc (scandium); and
the first insulating layer comprises 5×1019 cm-3 or more of at least one second element selected from the group consisting of F (fluorine), H (hydrogen) and D (deuterium); and
the at least one second element is positioned in an oxygen defect site of a crystal lattice of the first oxide.

20. The device according to claim 19, wherein:
the first layer and the second layer are GaN-based semiconductors; and
the second layer has a wider bandgap than a bandgap of the first layer.

21. The device according to claim 20, wherein:
the first layer and the second layer are GaN-based semiconductors; and
the second layer has a wider bandgap than a bandgap of the first layer.

22. The device according to claim 20, further comprising:
a second insulating layer provided between the second layer and the gate electrode,
wherein:
the second insulating layer comprises a second oxide of at least one third element selected from the group consisting of Hf (hafnium), Zr (zirconium), and Ti (titanium); and
the second insulating layer comprises $5 \times 10^{19}$ cm$^{-3}$ or more of at least one fourth element selected from the group consisting of F (fluorine), H (hydrogen), D (deuterium), V (vanadium), Nb (niobium), and Ta (tantalum), and $5 \times 10^{19}$ cm$^{-3}$ or more of at least one fifth element selected from the group consisting of N (nitrogen), P (phosphorus), As (arsenic), Sb (antimony), Bi (bismuth), Be (beryllium), Mg (magnesium), Ca (calcium), Sr (strontium), Ba (barium), Sc (scandium), Y (yttrium), La (lanthanum), and a lanthanoid (Ce, Pr, Nd, Pm, Sm, Eu, Gd, Tb, Dy, Ho, Er, Tm, Yb, and Lu).

23. The device according to claim 20, further comprising:
a second insulating layer provided between the second layer and the gate electrode,
wherein:
the second insulating layer comprises a second oxide of at least one third element selected from the group consisting of Al (aluminum), La (lanthanum), Y (yttrium), and Sc (scandium); and
the second insulating layer comprises $5 \times 10^{19}$ cm$^{-3}$ or more of at least one fourth element selected from the group consisting of F (fluorine), H (hydrogen), D (deuterium), V (vanadium), Nb (niobium), and Ta (tantalum), and $5 \times 10^{19}$ cm$^{-3}$ or more of at least one fifth element selected from the group consisting of N (nitrogen), P (phosphorus), As (arsenic), Sb (antimony), Bi (bismuth), Be (beryllium), Mg (magnesium), Ca (calcium), Sr (strontium), and Ba (barium).

24. The device according to claim 19, further comprising:
a second insulating layer provided between the second layer and the gate electrode,
wherein:
the second insulating layer comprises a second oxide of at least one third element selected from the group consisting of Hf (hafnium), Zr (zirconium), and Ti (titanium); and
the second insulating layer comprises $5 \times 10^{19}$ cm$^{-3}$ or more of at least one fourth element selected from the group consisting of F (fluorine), H (hydrogen), D (deuterium), V (vanadium), Nb (niobium), and Ta (tantalum), and $5 \times 10^{19}$ cm$^{-3}$ or more of at least one fifth element selected from the group consisting of N (nitrogen), P (phosphorus), As (arsenic), Sb (antimony), Bi (bismuth), Be (beryllium), Mg (magnesium), Ca (calcium), Sr (strontium), Ba (barium), Sc (scandium), Y (yttrium), La (lanthanum), and a lanthanoid (Ce, Pr, Nd, Pm, Sm, Eu, Gd, Tb, Dy, Ho, Er, Tm, Yb, and Lu).

25. The device according to claim 19, further comprising:
a second insulating layer provided between the second layer and the gate electrode,
wherein:
the second insulating layer comprises a second oxide of at least one third element selected from the group consisting of Al (aluminum), La (lanthanum), Y (yttrium), and Sc (scandium); and
the second insulating layer comprises $5 \times 10^{19}$ cm$^{-3}$ or more of at least one fourth element selected from the group consisting of F (fluorine), H (hydrogen), D (deuterium), V (vanadium), Nb (niobium), and Ta (tantalum), and $5 \times 10^{19}$ cm$^{-3}$ or more of at least one fifth element selected from the group consisting of N (nitrogen), P (phosphorus), As (arsenic), Sb (antimony), Bi (bismuth), Be (beryllium), Mg (magnesium), Ca (calcium), Sr (strontium), and Ba (barium).

* * * * *